US006262795B1

(12) United States Patent
Baker et al.

(10) Patent No.: US 6,262,795 B1
(45) Date of Patent: Jul. 17, 2001

(54) APPARATUS AND METHOD FOR THE IMPROVEMENT OF ILLUMINATION UNIFORMITY IN PHOTOLITHOGRAPHIC SYSTEMS

(75) Inventors: Daniel C. Baker, Milpitas; Kouros Ghandehari, San Jose; Satyendra S. Sethi, Pleasanton, all of CA (US)

(73) Assignee: Philip Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/141,807

(22) Filed: Aug. 28, 1998

(51) Int. Cl.$^7$ .......................... G03B 27/42; G03B 27/28; G01N 21/86; G03F 9/00
(52) U.S. Cl. ........................... 355/53; 355/125; 250/548; 430/22
(58) Field of Search ........................ 355/18, 125, 122; 430/5, 314, 322, 22, 7; 250/339.12, 548

(56) References Cited

U.S. PATENT DOCUMENTS

| | | | |
|---|---|---|---|
| 5,354,632 | * | 10/1994 | Dao et al. .................................. 430/5 |
| 5,916,735 | * | 6/1999 | Nakashima et al. .................. 430/314 |
| 5,936,707 | * | 8/1999 | Nguyen et al. ......................... 355/18 |
| 5,952,135 | * | 9/1999 | Ghandehari et al. .................. 430/22 |
| 6,040,578 | * | 3/2000 | Malin et al. ..................... 250/339.12 |
| 6,051,842 | * | 4/2000 | Yamamoto ............................ 250/548 |

OTHER PUBLICATIONS

"Conducting Polymers and Electrochromic Devices," http://www.chem.ufl.edu/~polymer/reynlds/condpoly.html, pp. 1–7, last updated Aug. 5, 1996.

"Chromogenic Materials," *Kirk–Othmer Encyclopedia of Chemical Technology*, 4th Ed., John Wiley & Sons, 6:312–333 (1993).

*Kirk–Othmer Encyclopedia of Chemical Technology*, 4th Ed., John Wiley & Sons, Supplement:496–499 (1998).

"Optical Materials Technology for Energy Efficiency and Solar Energy Conversion XV," Conference on Optical Materials Technology and Solar Energy Conversion, *Proceedings*, vol. 3138, Jul. 28–29, 1997, http://www.spie.org/web/meetings/programs.ms/sd97conferences/sd97_3138.html, pp. 1–3, last updated May 14, 1997.

"Swithchable Glazings," *The Pacific Energy Center*, Pacific Gas and Electric Company, http:/www.pge.com/pec/inftoc/switch.html, pp. 1–4, (undated).

\* cited by examiner

Primary Examiner—David M. Gray
Assistant Examiner—Peter B. Kim (57) ABSTRACT

An apparatus for forming a pattern in a photoresist material includes a light source to provide light for illuminating a portion of the photoresist material according to the pattern and a filter positioned in a path of the light. The filter includes a number of regions upon which a filtering material has been. The filtering material has a variable characteristic that is independently adjustable for each region to enhance the uniformity of the intensity of the light. Such characteristics include the thickness of the filtering material, the size of the portion of the region that is covered by the filtering material, or a voltage, current, electric field, or magnetic field applied to the filtering material of each region.

25 Claims, 4 Drawing Sheets

APPARATUS AND METHOD FOR THE IMPROVEMENT OF ILLUMINATION UNIFORMITY IN PHOTOLITHOGRAPHIC SYSTEMS

FIELD OF THE INVENTION

The present invention is generally directed to an apparatus for patterning a photoresist material. More particularly, the present invention relates to an apparatus having a filter member which is divided into regions having individual filtering characteristics.

BACKGROUND OF THE INVENTION

The manufacture of integrated circuits (ICs) requires many process steps which are executed with precision and accuracy. Precision is important because the ultimate dimensions of the components of integrated circuits are becoming smaller and smaller. Currently, some features have sizes on the order of less than one micron. Accuracy is important so that the related process steps are repeatable over time and produce results within a controlled range.

A significant part of many wafer manufacturing processes includes photolithography. Photolithography involves making an image of a part of the electronic circuit; rendering this part of the circuit onto a photographic plate, sometimes referred to as a photomask; and using the photomask and a light source to print that image onto a silicon wafer upon which a light-sensitive emulsion (e.g., a photoresist) has been applied. The exposed photoresist is developed to reveal the desired circuit elements. Other processes and treatments complete the structure of the layer.

An electronic circuit may have a number of photolithographic steps. The number of photolithographic steps often increases as circuits become more and more complex.

Figure 1A:
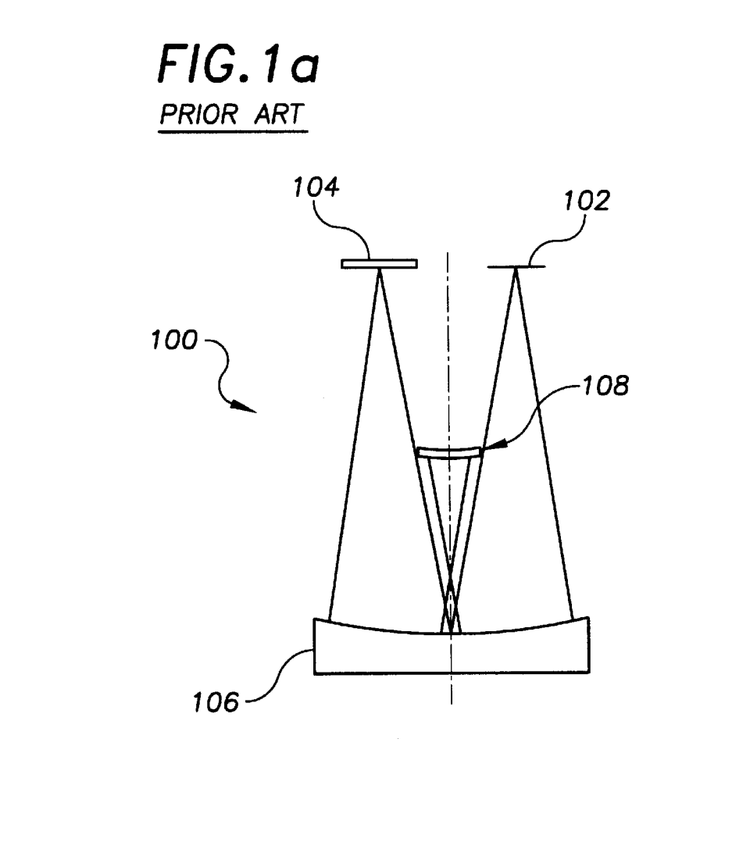
FIGS. 1a and 1b respectively illustrate a conventional projection aligner and a conventional stepper in accordance with an aspect of the present invention.

Two devices used for printing a mask pattern onto a silicon wafer are the projection aligner and the stepper. FIG. 1a shows one example of a projection aligner 100. One typical projection aligner 100, for example, includes two reflecting surfaces 106, 108. The light, typically supplied by a high energy source (not shown), such as a mercury lamp or a laser, passes through a point on a photomask 104 to a primary mirror 106. The light bounces off the primary mirror 106 onto a secondary mirror 108. From the secondary mirror 108, the light again bounces back to the primary mirror 106. The image on the photomask 104 is then projected onto a wafer 102. To assure accurate alignment, the aligner 100 relies upon receiving a reflected light signature of one or more alignment markers on the wafer 102 which can be aligned with corresponding markers on the photomask 104. In projection aligner printing, typically all of the product die on the wafer 102 are printed simultaneously. For example, if the wafer 102 has the capacity to hold 150 die, the mask has 150 images on it.

Figure 1B:
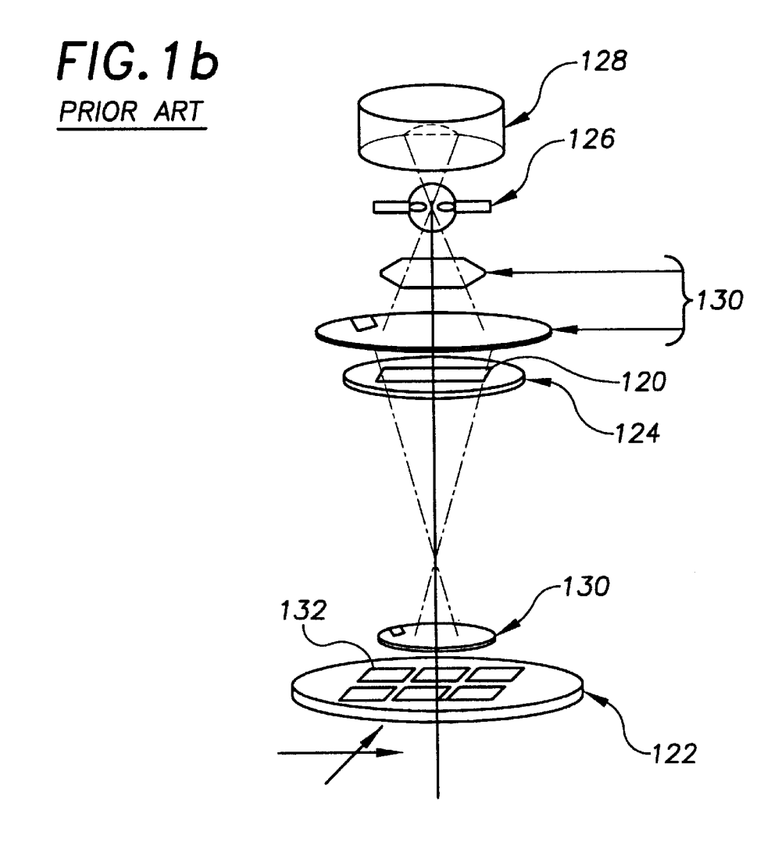

FIG. 1b shows one example of a stepper device. In using a stepper device, a pattern or mask 120 of a single layer of the semiconductor device 122 is placed on a reticle 124 and illuminated by a light source 126. A mirror 128 may be provided behind the light source 126 to reflect light back toward the wafer 122. The image on the reticle 124 may be two to five times (or more) larger than the final printed image on the wafer 122. The stepper optics 130 reduce the size of the reticle image to the final device size. The wafer 122 steps along and the aligner prints one die 132 at a time. Each die 132 may have an alignment marker to assure alignment throughout the building of the semiconductor device 122.

Each step builds an additional layer of the circuit upon the previously built ones. To assure that the layers line up with one another, the subsequent layers are printed relative to the first.

To properly pattern the photoresist material, it is often desirable that there be uniformity in the light which illuminates the photoresist material. Non-uniformities in the intensity of the illumination light may result in corresponding non-uniformities in the sizes and widths of device features. An exposure latitude is a measure of the amount of error allowed when forming the device features. This error arises from a number of sources other than the non-uniformity in the intensity of the illumination light including, for example, the reflection of light by the photoresist and layers on the wafer, as well as the amount of light absorbed by photoresist and the repeatability of energy for each exposure. Semiconductor devices formed according to 0.25 $\mu$m design rules have exposure latitudes of 10 to 20 percent. However, for 0.18 $\mu$m design rules, the exposure latitude may be 5 percent or less.

A typical lithography apparatus presently has an illumination uniformity specification of about 2 percent or less across the usable exposure field. This is a sizable portion of a 5% exposure latitude, given that there are other sources of error which are incorporated in the exposure latitude. Thus, by decreasing illumination non-uniformity, it may be possible to provide more accurate devices.

A large part of this non-uniformity arises from non-uniform or non-homogeneous characteristics of the lenses and other optical devices used in the photo lithography apparatus. These deviations result in an uncorrected error in printed feature size for any particular lithography tool. However, as feature sizes shrink, methods need to be found to reduce the errors caused by non-uniformity of the lenses and/or optical devices or those errors may contribute an increasingly significant portion of the allowed exposure latitude.

SUMMARY OF THE INVENTION

The present invention is directed to a filtering member and a device using the filtering member to increase the illumination uniformity of light used to pattern a photoresist layer on a semiconductor device. One embodiment of the invention is an apparatus for forming a pattern in a photoresist material. The apparatus includes a light source to provide light for illuminating a portion of the photoresist material according to the pattern and a filter member positioned in a path of the light. The filter member includes a plurality of regions with a filtering material disposed over the plurality of regions. The filtering material has a variable characteristic that is independently adjustable for each region to enhance the uniformity of the intensity of the light.

Another embodiment of the invention is a method for forming a pattern in a photoresist material. The method includes positioning a filter member in a light path of an illumination device. The filter member includes a plurality of regions and a filtering material disposed over the plurality of regions. The filtering material has a variable characteristic that is independently adjustable for each region to enhance the uniformity of the intensity of the light. The method also includes providing a mask in the light path. The mask has a predetermined pattern. Portions of the photoresist material are illuminated with light from the illumination device according to the predetermined pattern.

A further embodiment is a method for making a semiconductor device. The method includes positioning a filter member in a light path of an illumination device. The filter member includes a plurality of regions with each region being independently formed with a filtering material. The variable characteristic of the filtering material is independently manipulated to enhance uniformity and intensity of light from the illumination device. A mask is provided in the light path. The mask has a pattern. A photoresist is formed on the semiconductor device and portions of the photoresist layer are illuminated with light from the illumination device according to the pattern of the mask. The light passes through the filter member and the mask to illuminate the photoresist layer.

Yet another embodiment is a method for forming a filter member for use in an apparatus for patterning a photoresist material. The method includes forming a filtering material over a substrate. A plurality of regions of the filter member are then defined and, for each region, a portion of the filtering material is removed.

Another embodiment is a method of forming a filter member for use in an apparatus for patterning a photoresist material. A plurality of regions on a substrate are defined and at least two electrodes are formed in contact with each region. A filtering material is formed over the substrate. An absorptivity characteristic of the filtering material for the wavelength region of interest depends on a magnitude of an electric field within the filtering material. The electric field is provided by application of a potential difference between the two electrodes.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE ILLUSTRATED EMBODIMENTS

The present invention is believed to be applicable to methods and devices for patterning a device layer of a semiconductor device. In particular, the present invention is directed to improving the uniformity in intensity of light which illuminates a photoresist layer on a semiconductor device. This improvement in uniformity is accomplished by providing a filtering member which is divided into regions that have an individually adjustable filtering characteristic. While the present invention is not so limited, an appreciation of various aspects of the invention will be gained through a discussion of the exemplary devices and processes provided below.

Figure 2:
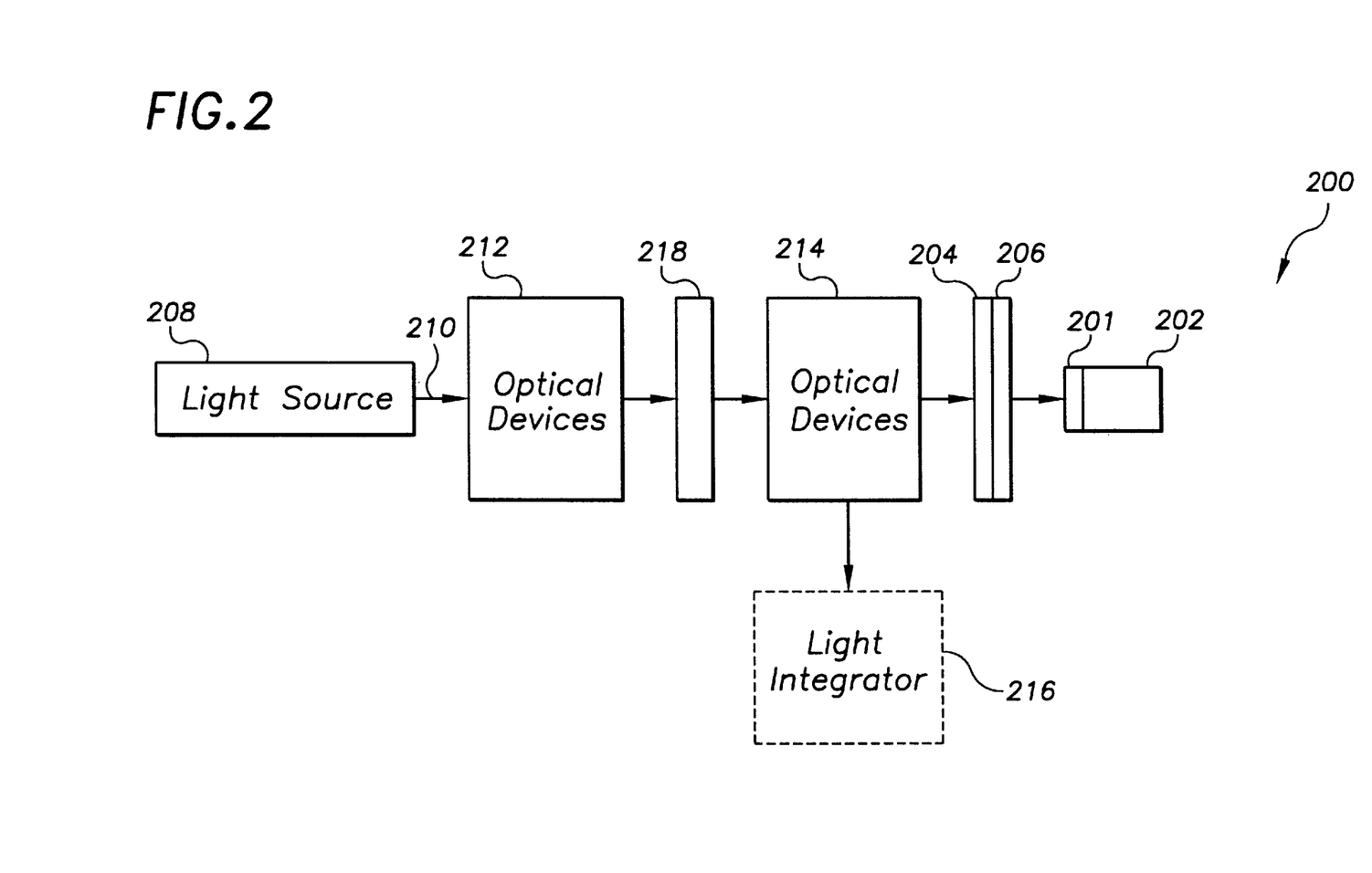
FIG. 2 is a structural representation of an apparatus for patterning a photoresist material in accordance with the present invention.

FIG. 2 illustrates an optical system 200 for illuminating a semiconductor device 202 in order to pattern a photoresist layer 201 formed over a device layer of the semiconductor device 202. Although this particular optical system 200 is illustrated for use in a stepper device, such as that illustrated in FIG. 1b, it will be appreciated that an optical system can be made according to the invention for use in a projection aligner, such as that illustrated in FIG. 1a.

The desired circuit pattern is typically provided on a mask 204 that is positioned on a reticle 206 of the optical system 200. In some embodiments, the mask 204 has the same scale as the desired circuit pattern on the semiconductor device 202. In other embodiments, however, the mask 204 has a significantly larger scale (e.g., two to five (or more) times larger) than the actual image of the pattern provided on the photoresist. In such embodiments, the light 210 that passes through the mask and is directed toward the semiconductor device 202 also travels through a reducing lens (not shown), or other optical device capable of reducing the image, either prior to or subsequent to traveling through the mask 204.

The optical system 200 has a number of other elements. The optical system 200 has a light source 208 which provides light for illumination of the semiconductor device 202. The light source 208 may include one or more individual light sources. These light sources may provide light that is either monochromatic (i.e. light having a single wavelength or a relatively narrow band of wavelengths) or polychromatic (i.e. light having two or more separate wavelengths or a relatively large band of wavelengths). Examples of monochromatic light sources are lasers or light emitting diodes (LEDs). Examples of polychromatic light sources are lamps, such as mercury or argon lamps, and incandescent or fluorescent lights. These polychromatic light sources might be considered 'monochromatic' if the light is subsequently filtered to provide only a single narrow band of wavelengths.

Often, the photoresist is illuminated with light from the optical system 200 that has only a single wavelength or a narrow band of wavelengths. The photoresist is typically a material that is chemically or physically altered by illumination with light having a specific wavelength or range of wavelengths. The choice of photoresist typically depends on the wavelength of light used to form the pattern. The particular choice of wavelength for illuminating the semiconductor device 202 depends on the size of the features that are to be patterned on the semiconductor device 202. Current 0.25 $\mu$m generation design rules call, for example, for patterning 0.4 $\mu$m lines and spaces in metal interconnect layers. The exposure wavelength for patterning a photoresist for 0.4 $\mu$m design rules is typically 365 nm. For more aggressive gate layer design rules, requiring 0.25 $\mu$m lines and spaces, the exposure wavelength is 248 nm.

Future semiconductor devices are expected to have, for example, gatewidths of 0.18 $\mu$m and metal line widths and spaces of 0.3 $\mu$m. This typically requires light with shorter wavelengths. One convenient wavelength is 248 nm, available from a KrF laser. Furthermore, semiconductor devices may be designed with 0.13 µm or smaller gatewidths. These devices typically requires photoresist patterning with even shorter wavelengths, including, for example, the 193 nm line of an ArF laser.

Thus, the choice of the light source 208 and the photoresist 201 on the semiconductor device 202 often depends on the particular wavelength of light that is to be used. In addition, the parameters and construction materials of other optical devices, including, for example, lenses and mirrors used in the optics of the optical system 200, may also depend on the wavelength of light that is used. For example, lenses are typically made of a UV transparent material to operate at the wavelengths described above.

Returning to FIG. 2, light 210 is emitted by the light source 208 and then travels through one or more sets of optical devices 212, 214. Examples of such optical devices include filters, lenses, condensers, collimators, mirrors, and light extractors. These optical devices 212, 214 are used to collect, focus, and project the light along a defined path within the optical system 200. A wide variety of configurations of optical devices may be used in the optical system 200. The operation and combination of these devices is known, as is their combination to form optical systems 200, such as a projection aligner or a stepper, to pattern a photoresist on a semiconductor device.

Certain of the optical devices 212 may used to decrease the non-uniformity of the light traveling through the optical system 200 by combining and spreading the light from different portions of the beam. Such devices may be termed homogenizers. Examples of suitable homogenizers include a fly's eye lens or the like.

Also often included in the optical system 200 is an optional light integrator 216 which determines the total intensity of light being passed along the beam to the semiconductor device 202. It is often desirable that the light beam have greater than a threshold light intensity for illuminating the semiconductor device 202. Otherwise, a photoresist 201 on the semiconductor device 202 may be insufficiently illuminated to completely form the pattern according to the mask 204. It may also be desirable to have an upper threshold limit on the intensity of light illuminating the photoresist 201 on the semiconductor device 202. Otherwise, the photoresist 201 may be illuminated with too much light which typically increases the feature size due, at least in part, to light scattered into regions that are not directly illuminated. The light integrator 216 is used to monitor the total intensity of the light beam to determine if too little or too much light is being generated.

Despite all of the lenses and optical devices provided in the device 200 including, for example, the homogenizer and the light integrator, it is found that light illuminating the semiconductor device 202 typically has a variation in intensity of ±2% or more. The variation in illumination intensity is due, at least in part, to non-homogeneous characteristics (e.g., imperfections) in the optical devices 212, 214 and the light source 208. These imperfections and non-homogeneous characteristics are often not entirely correctable by devices, such as the homogenizer or light integrator. Furthermore, at least some of these non-homogeneous characteristics are found in optical devices 212, 214 further along the light path than the homogenizer.

Figure 3:
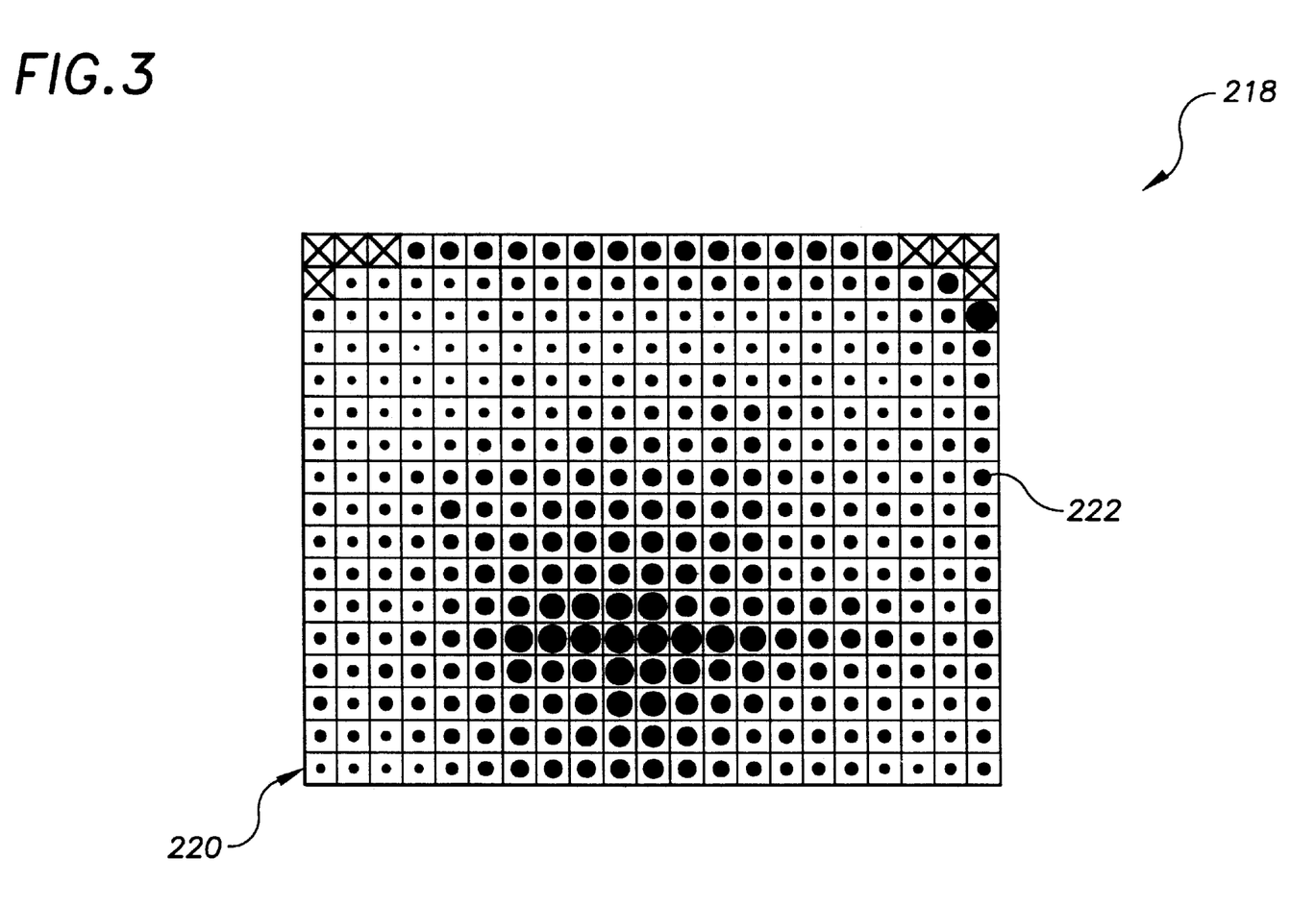
FIG. 3 is a graphical representation of a top view of one embodiment of a filter member in accordance with the present invention.

To further correct these non-homogeneous characteristics and imperfections, a filter member 218 is provided in the light path. One example of a filtering member 218 is graphically illustrated in FIG. 3. The filtering member 218 is divided into a number of regions 220. These regions may have a variety of shapes including square (as shown in FIG. 3), rectangular, diamond-shaped, spherical, or even irregular. Each of the regions 220 includes a filtering material 222 which is capable of absorbing or reflecting at least some of the light 210. The filtering material is often formed on a substrate (as shown in FIGS. 4–7). The substrate is typically made of a material which is transparent or uniformly absorbs or reflect the light having the desired wavelength. Suitable substrates include, for example, glass, transparent plastic, quartz, fused silica, and calcium fluoride.

The filtering material 222 typically has a characteristic that may be varied to alter the amount of light reflected or absorbed. By choosing the correct amount of reflection or absorption for each region, the uniformity in the illumination light intensity at the semiconductor device 202 may be increased. In one example embodiment of the present invention, the variation in the illumination light intensity is less than about 0.5%.

Typically, the uniformity in light intensity is not determined for the light immediately exiting the filter member 218. Rather, the uniformity is measured at the level of the photoresist 201. This allows the filter member 218 to correct the non-homogeneous characteristics of optical devices 212, 214 positioned both before and after the filter member 218 in the light path.

There are a variety of characteristics 222 which may be varied to increase the illumination intensity uniformity. Suitable characteristics include the thickness of the filtering material 222; the size of the filtering material 222 provided in each region 220 (e.g., the size of a dot of filtering material 222 as shown in FIG. 3); or the amount of current, voltage, electric field, or magnetic field applied to the filtering material 222 in each region 220. Other characteristics may also be used.

The size of the regions 220 may be different for each filter member 218. For example, there may be 10 to 20 regions per side, resulting in a total of 100 to 400 regions over the filter member 218. The actual number of regions typically depends on the desired resolution and the size of the filter member. Larger regions are typically easier to form and precisely control, however, they also typically result in less uniformity of the illumination intensity.

In some embodiments, the size of the regions may vary. For example, regions near the periphery of the filter member 218 may be smaller than those near the center of the filter member 218, because there is more likely to be inhomogeneities near the edges of optical devices.

A filtering material 222 is chosen that absorbs or reflects light in the wavelength range that is used to illuminate and pattern the photoresist layer 201. Examples of suitable filtering materials include chromium oxide, chromium metal, and molybdenum metal. Preferably, the variable characteristic of the filtering material 222 provides for absorption or reflection of the light over the wavelength of interest as a linear or other definable function of the characteristic. Typically, the filtering material 222 has an absorption or reflection characteristic that allows transmission of light having the desired wavelength at 50% or greater, preferably 75% or greater, and more preferably 90% or greater, over the desired range of the variable characteristic. This allows for efficient use of the light while retaining the flexibility to adjust the amount of light transmitted through each region to provide the desired illumination uniformity. However, the minimum percentage of light that is transmitted may vary depending on the range of non-homogeneous characteristics of the optical devices 212, 214. For example, in an optical system with ±10% variance in illumination intensity prior to adding the filter member, the minimum transmitted light may be 80% or lower, otherwise the entire range of variation (20% in this case) may not be compensated.

Figure 4:
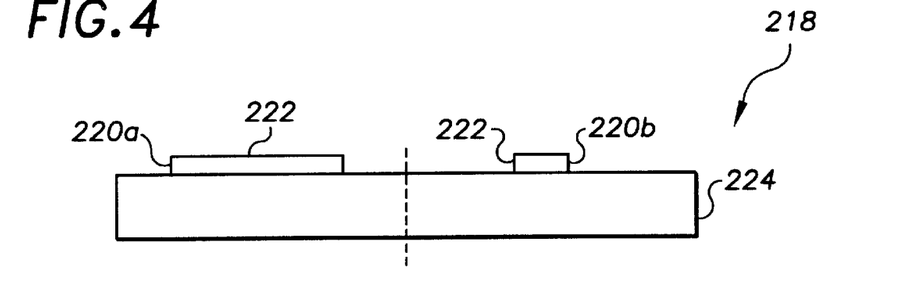
FIG. 4 is a cross-section of two adjacent regions of the filter member of FIG. 3.

In some embodiments, the adjustable filtering material characteristic is the amount of filtering material 222 provided on each region 220 of the filter member 218. For example, filtering material 222 may be provided at a uniform thickness at discrete points on a substrate material 224 of a filter member 216 which is divided into regions 220, as illustrated in FIGS. 3 and 4. In some embodiments, the uniformity in the thickness of the filtering material 222 may be relaxed to the extent that the filtering material 222 absorbs all or nearly all (e.g., greater than 80% of the light) that directly intercepts the filtering material 222. In other embodiments, a significant portion of the light is transmitted through the filtering material 222.

The variability in the amount of filtering material 222 provided in each region is provided by varying the amount of area of that region 220 covered by the filtering material 222. FIG. 4 illustrates two adjacent regions 220a, 220b which are covered by differing amounts of filtering material 222. The region 220b with the smallest amount of filtering material 222 typically transmits a greater amount of light than the region 220a with more filtering material 222. The filtering material 222 may be deposited on the substrate 224 in the form of dots, as shown in FIG. 3, or with any other structure, including, for example, squares, rectangles, ovoids, or even irregular and/or discontinuous figures. Alternatively, the dots in FIG. 3 may correspond to the portions of each region 220 which are not covered by filtering material 222.

Because the light is non-uniformly transmitted over each region due to the presence of filtering material 222 in some portions of each region 220, but not others, a homogenizer is typically provided in the light path after the filtering member 218. The homogenizer may then combine the light and more evenly distribute it over the light path. Typical homogenizers are capable of uniformly distributing light over small regions, but they are not as successful at distributing the light uniformly over the entire light beam. Thus, the homogenizer can be used to even out the small scale variations caused by the filter member but may not be able to even out larger scale variations caused by optical device non-homogeneous characteristics.

An exemplary method for forming the filtering member illustrated in FIGS. 3 and 4 includes forming a uniform layer of the filtering material 222 over the substrate 224. The layer of filtering material 222 may be formed by a variety of techniques, including, for example, chemical vapor deposition (CVD), physical vapor deposition, plasma deposition, and sputtering. A photoresist layer (not shown) may be formed over the filtering material 222. The photoresist layer may be illuminated with light according to a pattern provided by a mask (not shown), by standard photolithographic methods. A portion of the photoresist layer and the device layer is then removed according to the pattern (e.g., the dots are formed as shown in FIG. 3). A variety of techniques may be used for removing the portions of the layers, including, for example, wet etching, dry etching, and plasma etching. The photoresist layer is then stripped away to leave the filter member 218. It will be appreciated that other techniques may be used to form the filter member 218.

The mask for making the filter member 218 may be characterized in a variety of ways. For example, the illumination intensity in the plane of the semiconductor device may be mapped across the exposure field by, for example, attaching a power meter probe to the stage of the exposure tool and incrementally positioned throughout the field. Often, this mapping is performed under operating conditions as the illumination intensity may vary under changing conditions such as temperature, pressure, and the amount of time that the device has been operating. The mapping may be averaged over a period of time to represent an average of the illumination intensity.

This map of the exposure region can be used to determine the composition of each of the regions of the filter member 218. In some embodiments, a one-to-one correspondence between regions of the filter member 218 and similar regions formed on the map can be used to determine the appropriate value of the adjustable characteristic for the filtering material 222 in each region 220. In other embodiments, more complex functions can be used to determine the adjustable characteristic including, for example, a weighted averaging (based on the distance from the corresponding region) of the illumination intensities of neighboring regions on the mapping. In some embodiments, two or more filter members 218 may be formed, each attempting to improve on the next, by testing each filter member and then using the measured illumination intensities to form the next filter member in the series. In other embodiments, (particularly, the filtering members which rely on electrical characteristics, as discussed below) the characteristics may be varied using the same filter member until a desired uniformity in illumination intensity is achieved.

Figure 5:
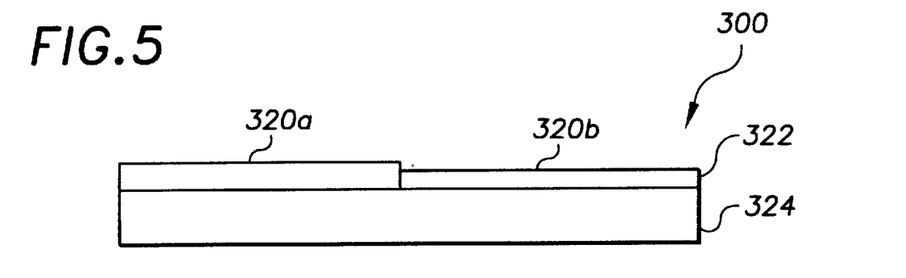
FIG. 5 is a cross-section of two adjacent regions of another embodiment of a filter member in accordance with the present invention.

Another embodiment of a filtering member 300 is presented in FIG. 5 which illustrates two adjacent regions 320a, 320b. In this embodiment, the amount of filtering material 322 deposited on the substrate 324 for each region 320a, 320b is varied by varying the thickness of the filtering material 322. This configuration may be useful with a filtering material 322 which absorbs, rather than reflects, light, as the absorption of light is typically a linear function of the distance that the light travels through the material, at least over a limited range of distances.

One method for forming the filter member 300 includes forming a uniform thickness of the filtering material 322 over the substrate 324 and then masking portions of the filtering material 322 and etching the remainder of the filtering material 322 for a period of time to remove a desired amount of material. The mask and etch process is performed several times. Those regions 320b which are to have a thinner layer of filtering material 322 are left unmasked for more etching steps than the regions 320a with thicker layers of filtering material 322. The number of mask and etch steps determines the number of different thicknesses that may be found on the filter member 318.

Figure 6:
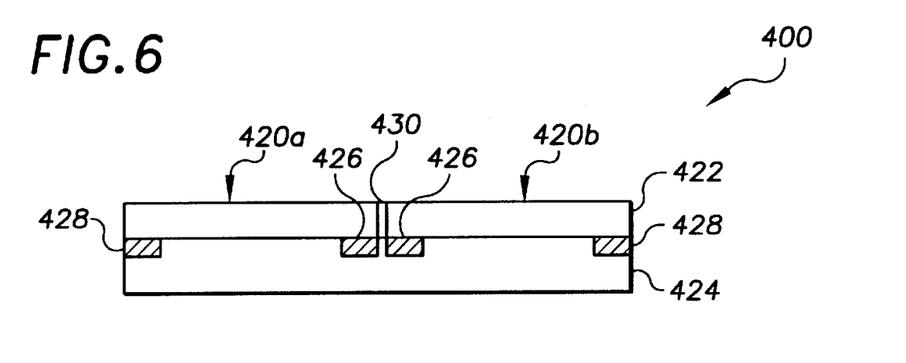
FIG. 6 is a cross-section of two adjacent regions of a third embodiment of a filter member in accordance with the present invention.
Figure 7:
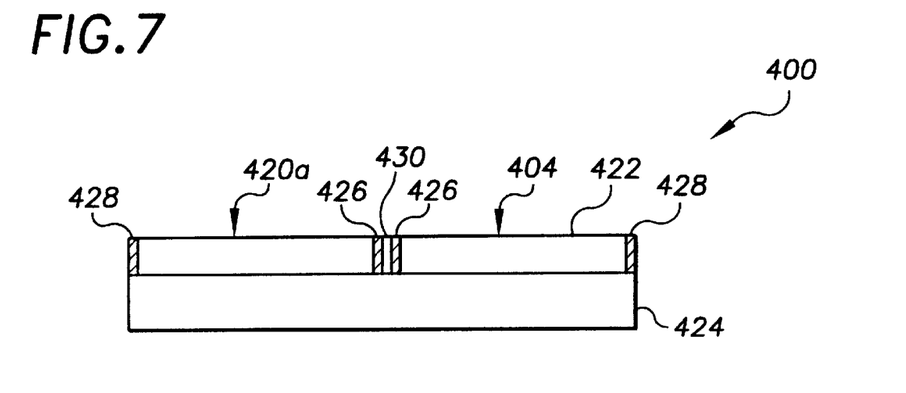
FIG. 7 is a cross-section of two adjacent regions of a fourth embodiment of a filter member in accordance with the present invention.

In another embodiment, illustrated in FIGS. 6 and 7, each region 420a, 420b of the filtering member 400 has an electromagnetically-responsive filtering material 422 deposited on a substrate material 424. The absorption of light by the filtering material 422 varies with an applied current, voltage, electric field, and/or magnetic field. Examples of such filtering materials include materials which have a band gap that is a function of the applied current, voltage, electric field, and/or magnetic field. Examples of suitable materials include electrochromic materials, including both organic and inorganic compounds. Examples of inorganic compounds include a variety of metal oxides, including, for example, tungsten oxide, molybdenum oxide, titanium oxide, tantalum oxide, iridium oxide, and nickel oxide. Examples of organic compounds include viologens, such as 1,1'-diheptyl-4,4'-bipyridinium dibromide, as well as o-tolidine(4,4'-diamino-3,3'-dimethylbiphenyl) and 2-tert-butylanthraquinone, and doped organic compounds, such as polyanaline, polypyrrole, polythiophene, and poly(isothianaphthalene). General discussion on these and other electrochromic materials is provided in *Kirk-Othmer Encyclopedia of Chemical Technology, Fourth Ed.*, J. I. Kroshwitz and M. Howe-Grant eds., John Wiley & Sons, Vol. 6, p. 312–321 (1993) and the articles cited therein, the text thereof being incorporated herein by reference.

Each region 420 of the filter member 400 has two (or more) electrodes 426, 428 separated by portion 430 and associated with the region. It is through these electrodes that a current, voltage, or electric field may be applied. If a variable magnetic field is used to adjust the absorptivity of the filtering material 422, then only a single current bearing line (not shown) is needed (although more than one line may be used). Electric field manipulation of the filtering material 422 may be desirable over magnetic field manipulation, because an electric field can typically be provided at lower power.

The electrodes 426, 428 or current bearing line (not shown) are attached to external electronics (not shown) that provide the voltage or current needed to apply the voltage, current, electric field, or magnetic field to the filtering material 422. A variety of different electrode configurations may be used. For example, transparent electrodes, for example, electrodes made using thin layers of materials such as indium tin oxide, are used. FIGS. 6 and 7 illustrate two other possible configurations. The electrodes 426, 428 may be provided in the substrate 424, as illustrated in FIG. 6. These electrodes may be formed, for example, by etching traces in the substrate 424 and then filling those traces with a conductive material, including, for example, metals, alloys, conductive polymers, or semiconductors.

As another example, the electrodes 426, 428 are formed on the substrate and adjacent to the filtering material 422, as illustrated in FIG. 7. These electrodes may be formed, for example, by etching traces into the filtering material 422 and then filling the traces with a conductive material. Another method for making the electrodes, 426, 428 is to deposit the electrodes 426, 428 prior to forming the filtering material 422 on the substrate 424.

Ideally, the conductive material that forms the electrodes 426, 428 is transparent to light having the wavelength of interest so that the conductive material does not absorb or reflect the light from the light source. However, this is not always possible. Typically, at least some of the light is reflected or absorbed by the electrodes 426, 428. Thus, light from the filter member 400 may be directed through a homogenizer to remove the non-uniformities introduced in the light beam due to the electrodes 426, 428. To reduce the effect of the electrodes 426, 428 on the light beam, the electrodes may be formed as thin as possible, consistent with the amount of current which carried by the electrodes 426, 428. Furthermore, the electrodes 426, 428 may be formed so that they present a small cross-section to the light beam (i.e., the length of the electrode parallel to the direction of the light beam may be larger than the width of the electrode perpendicular to the direction of the light beam), as shown in FIG. 7.

In operation, a potential may be developed across the electrodes 426, 428 to form a voltage drop, current, or electric field. In some embodiments, one of the electrodes is held at ground and the potential of the other electrode is varied depending on the desired amount of absorptivity. The grounded electrode may be used by two or more regions simultaneously. Each region may be provided with a separate varying-potential electrode. To obtain a magnetic field, an appropriate current is applied to the current bearing line.

An insulating layer 430 is optionally placed between the regions. The insulating layer 430 is typically formed of a material which is less conductive than the filtering material 422. Alternatively, the electrodes of neighboring regions may be evenly spaced apart so that a voltage, current, or electric field is formed in the region between the electrodes according to the potentials of the electrodes.

The potential on each of the electrodes (or the current on the current-bearing wire, if a variable magnetic field is used) is often controlled by a processor. This particular configuration of an optical system allows for real-time variation of the light transmitted through the regions. Thus, if new illumination intensity data is available, a different configuration of regions in the filter member may be formed based on the new data. Using the configuration exemplified by FIGS. 6 and 7, new customized filter member would not be necessary for each different light source or optical system. An appropriate filter member could be formed based on illumination measurements and appropriate adjustments to the potentials or currents associated with each region.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification. The claims are intended to cover such modifications and devices.

We claim:

1. An apparatus for forming a pattern in a photoresist material, the apparatus comprising:
    a light source to produce light for illuminating a portion of the photoresist material according to a pattern; and
    a filter member positioned in a path of the light, the filter member comprising a plurality of regions and a filtering material disposed over the plurality of regions, the filtering material having a variable characteristic that is independently adjustable for each region to enhance the uniformity of the intensity of the light.

2. The apparatus of claim 1, wherein, when light from the light source passes through the filter member and illuminates the portion of the photoresist material, the light illuminating the portion of the photoresist material has a variation in intensity of 0.5% or less.

3. The apparatus of claim 1, wherein the filtering material comprises a light-absorbent material.

4. The apparatus of claim 3, wherein the light-absorbent material comprises UV light-absorbent material.

5. The apparatus of claim 4, wherein the filtering material comprises chromium oxide.

6. The apparatus of claim 1, wherein the filter member further comprises a substrate and the filtering material is disposed on the substrate.

7. The apparatus of claim 1, wherein the variable characteristic comprises a thickness of the filtering material in.

8. The apparatus of claim 7, wherein the thickness of the filtering material is varied in each region by etching the filtering material for a variable period of time.

9. The apparatus of claim 1, wherein the variable characteristic comprises an amount of the area in a region covered by the filtering material.

10. The apparatus of claim 1, wherein the variable characteristic comprises an electrical state in a filtering material.

11. The apparatus of claim 10, wherein the electrical state of the filtering material comprises a magnitude of an electrical field in the filtering material.

12. The apparatus of claim 1, wherein the filtering member further comprises, for each of the plurality of regions, at least two electrodes in contact with the filtering material of the region.

13. The apparatus of claim 12, wherein the filtering member further comprises a substrate, the filtering material being formed over the substrate and the at least two electrodes being formed in the substrate and under the filtering material.

14. The apparatus of claim 12, wherein the filtering member further comprises a substrate, the filtering material being formed over the substrate and the at least two electrodes being formed adjacent to the filtering material and over the substrate.

15. The apparatus of claim 12, wherein one of the at least two electrodes is common to at least two of the regions.

16. The apparatus of claim 1, wherein at least 90% of light incident on each region of the filter member is transmitted.

17. The apparatus of claim 1, wherein the apparatus further comprises a mask positioned in the path of the light for patterning the photoresist layer.

18. An apparatus for forming a pattern in a photoresist material, the apparatus comprising:
 a light source to produce light for illuminating a portion of the photoresist material according to a pattern; and
 a filter member positioned in a path of the light, the filter member comprising a plurality of regions and a filtering material disposed over the plurality of regions and extending to all edges of the filter member, the filtering material having a variable characteristic that is independently adjustable for each region to enhance the uniformity of the intensity of the light.

19. The apparatus of claim 18, wherein the filtering material comprises a UV light-absorbent material and the variable characteristic of the filtering material comprises a thickness of the UV light absorbent material.

20. The apparatus of claim 19, wherein the filtering material comprises chromium oxide.

21. The apparatus of claim 19, wherein the thickness of the filtering material is varied in each region by etching the filtering material for a variable period of time.

22. The apparatus of claim 18, wherein the variable characteristic comprises an electrical state of the filtering material, the electrical state of the filtering material comprises a magnitude of an electrical field in the filtering material.

23. The apparatus of claim 18, wherein the filtering member further comprises at least two electrodes in contact with the filtering material of the region for each of the plurality of regions.

24. The apparatus of claim 23, wherein the filtering member further comprises a substrate, the filtering material being formed over the substrate and the at least two electrodes being formed in the substrate and under the filtering material.

25. The apparatus of claim 23, wherein the filtering member further comprises a substrate, the filtering material being formed over the substrate and the at least two electrodes being formed adjacent to the filtering material and over the substrate.

* * * * *

UNITED STATES PATENT AND TRADEMARK OFFICE
CERTIFICATE OF CORRECTION

PATENT NO. : 6,262,795 B1  
DATED : July 17, 2001  
INVENTOR(S) : Baker et al.

Page 1 of 1

It is certified that error appears in the above-identified patent and that said Letters Patent is hereby corrected as shown below:

Column 10,  
Line 61, after "material", please delete "in".

Column 11,  
Line 2, "in a" should read -- of the --.

Signed and Sealed this

Twenty-third Day of April, 2002

Attest:

Attesting Officer

JAMES E. ROGAN  
Director of the United States Patent and Trademark Office